US012666742B2

(12) United States Patent
Kim et al.

(10) Patent No.: US 12,666,742 B2
(45) Date of Patent: Jun. 23, 2026

(54) WAFER-TO-WAFER BONDING STRUCTURE AND IMAGE SENSOR INCLUDING THE SAME

(71) Applicant: Samsung Electronics Co., Ltd., Suwon-si (KR)

(72) Inventors: Sanghoon Kim, Suwon-si (KR); Seongho Oh, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 398 days.

(21) Appl. No.: 18/223,788

(22) Filed: Jul. 19, 2023

(65) Prior Publication Data

US 2024/0204027 A1     Jun. 20, 2024

(30) Foreign Application Priority Data

Dec. 16, 2022     (KR) ......................... 10-2022-0177543

(51) Int. Cl.
H10F 39/00          (2025.01)

(52) U.S. Cl.
CPC ......... H10F 39/809 (2025.01); H10F 39/811 (2025.01)

(58) Field of Classification Search
CPC .... H10F 39/809; H10F 39/018; H10F 39/811; H01L 23/5386; H01L 23/5385; H01L 23/5384; H01L 23/5383; H10W 72/07331; H10W 72/07332; H10W 72/07327
See application file for complete search history.

(56) References Cited

U.S. PATENT DOCUMENTS

| | | | | |
|---|---|---|---|---|
| 5,753,536 A | * | 5/1998 | Sugiyama | ........... H10W 20/023 |
| | | | | 257/E21.705 |
| 10,224,312 B1 | | 3/2019 | Jones | |
| 2010/0258890 A1 | * | 10/2010 | Ahn | ........................ H01L 24/81 |
| | | | | 257/E31.127 |
| 2013/0020704 A1 | * | 1/2013 | Sadaka | ............... H10W 74/134 |
| | | | | 438/455 |
| 2013/0207268 A1 | * | 8/2013 | Chapelon | ................ H01L 24/80 |
| | | | | 257/751 |
| 2016/0284753 A1 | * | 9/2016 | Komai | ................... H10F 39/182 |
| 2018/0151757 A1 | * | 5/2018 | Sato | ....................... H10F 39/018 |
| 2019/0096931 A1 | | 3/2019 | Endo et al. | |
| 2019/0279952 A1 | * | 9/2019 | Tagami | .................. H10B 43/27 |
| 2020/0020733 A1 | | 1/2020 | Fujii et al. | |
| 2020/0035630 A1 | | 1/2020 | Kameshima | |

(Continued)

*Primary Examiner* — Erik Kielin
(74) *Attorney, Agent, or Firm* — Muir Patent Law, PLLC

(57)          ABSTRACT

The inventive concept provides an image sensor including a step having a slope shape and an image sensor including the wafer-to-wafer bonding structure. The image sensor includes a first substrate including a pixel array, a first multilayer wiring, a first insulation layer formed on a first junction surface to pass through the first insulation layer and a second substrate on the first substrate, wherein the second substrate includes a logic circuit, a second multilayer wiring, a second insulation layer on a second junction surface opposite to the first junction surface and a second metal pad passing through the second insulation layer, and a second step formed in the second junction surface engages with a first step formed in the first junction surface in a symmetrical slope shape to form direct bonding between the first substrate and the second substrate.

19 Claims, 15 Drawing Sheets

(56) References Cited

U.S. PATENT DOCUMENTS

| | | |
|---|---|---|
| 2020/0035643 A1 | 1/2020 | Hirata et al. |
| 2020/0126906 A1* | 4/2020 | Uzoh ................. H10W 20/062 |
| 2024/0113055 A1* | 4/2024 | Polomoff ............... H01L 24/05 |

* cited by examiner

302(300)

102(100)

400

202(200)

BB

AA

201(200)

400

101(100)

301(300)

WAFER-TO-WAFER BONDING STRUCTURE AND IMAGE SENSOR INCLUDING THE SAME

CROSS-REFERENCE TO RELATED APPLICATION

This application is based on and claims priority under 35 U.S.C. § 119 to Korean Patent Application No. 10-2022-0177543, filed on Dec. 16, 2022, in the Korean Intellectual Property Office, the disclosure of which is incorporated by reference herein in its entirety.

BACKGROUND

The inventive concept relates to a wafer-to-wafer bonding structure and an image sensor including the same, and more particularly, to a wafer-to-wafer bonding structure capable of strong direction bonding between wafers and an image sensor including the wafer-to-wafer bonding structure.

To implement the high performance and high resolution of image sensors, stack sensors are being mainly used where a pixel structure is formed on an upper wafer and a logic circuit is provided on a lower wafer. A bonding structure between copper pads is needed for reducing the size of chips used in stack sensors. Moreover, bonding technology between copper pads may be introduced for connecting an upper wafer to a lower wafer, between pixels of active pixel sensors.

As a number of bonding is applied for an electrical connection between wafers, a possibility of debonding where misalignment occurs between conductive pads increases. Therefore, research for solving such a problem and detecting a stronger bonding structure is being done.

SUMMARY

The inventive concept provides a wafer-to-wafer bonding structure in which debonding, occurring in a copper-to-copper bonding structure of a portion where a plurality of wafers are bonded to each other to form direct bonding, is improved.

The inventive concept provides an image sensor including a plurality of wafers to which the wafer-to-wafer bonding structure is applied.

The object of the inventive concept is not limited to the aforesaid, but other objects not described herein will be clearly understood by those of ordinary skill in the art from descriptions below.

To accomplish the objects, the inventive concept provide the following wafer-to-wafer bonding structure.

According to an aspect of the inventive concept, there is provided an image sensor including a first substrate including a pixel array, a first multilayer wiring, a first insulation layer and a first metal pad buried in the first insulation layer and a second substrate on the first substrate, wherein the second substrate includes a logic circuit, a second multilayer wiring, a second insulation layer facing the first insulation layer and a second metal pad buried in the second insulation layer, and wherein a second step formed in the second junction surface engages with a first step formed in the first junction surface in a symmetrical slope shape to form direct bonding between the first substrate and the second substrate.

According to another aspect of the inventive concept, there is provided an image sensor including a first substrate including a pixel array, a first multilayer wiring, a first insulation layer and a plurality of first metal pads arranged apart from one another in a horizontal direction to each be buried in the first insulation layer and a second substrate on the first substrate, wherein the second substrate includes a logic circuit, a second multilayer wiring, a second insulation layer facing the first insulation layer and a plurality of second metal pads arranged apart from one another in a horizontal direction to each be buried in the second insulation layer, and wherein a plurality of second steps formed in the second junction surface respectively engage with a plurality of first steps respectively contacting the plurality of second steps in a symmetrical slope shape to form direct bonding between the first substrate and the second substrate.

To accomplish the objects, the inventive concept provide the following image sensor.

According to another aspect of the inventive concept, there is provided an image sensor including a lower substrate and an upper substrate stacked on and bonded to the lower substrate, wherein the lower substrate includes a pixel array, a lower multilayer wiring, a lower insulation layer formed on an upper surface of the lower substrate, a lower metal pad buried in the lower insulation layer, and a lower step formed in the lower metal pad, the upper substrate includes a logic circuit, an upper multilayer wiring, an upper insulation layer formed on a lower surface of the upper substrate, an upper metal pad buried in the upper insulation layer, and an upper step formed in the upper metal pad, and wherein the upper step engages with the lower step in a symmetrical slope shape to form direct bonding between the upper substrate and the lower substrate.

BRIEF DESCRIPTION OF THE DRAWINGS

Embodiments will be more clearly understood from the following detailed description taken in conjunction with the accompanying drawings in which.

DETAILED DESCRIPTION OF THE EMBODIMENTS

Figure 1:
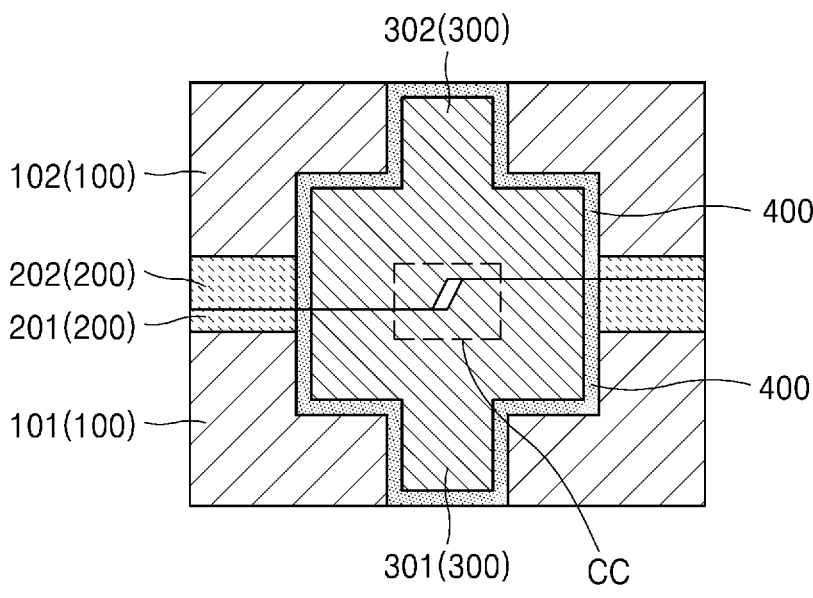
FIG. 1 is a cross-sectional view schematically illustrating a wafer-to-wafer bonding structure, according to an example embodiment.

Hereinafter, embodiments will be described in detail with reference to the accompanying drawings. Like reference labels refer to like elements throughout.

In this disclosure, when an element is described as being connected to another element, the element may be directly connected to the other element, or a third element may be interposed therebetween. Similarly, when an element is described as being on another element, the element may be just on the other element, or a third element may be interposed therebetween. In contrast, when an element is referred to as being "directly connected" or "directly coupled" to another element, or as "contacting" or "in contact with" another element (or using any form of the word "contact"), there are no intervening elements present at the point of contact.

The term "buried" may refer to structures, patterns, and/or layers that are formed at least partially below a top surface of another structure, pattern, and/or layer. In some embodiments, when a first structure, pattern, and/or layer is "buried" in a second structure, pattern, and/or layer, the second structure, pattern, and/or layer may surround at least a portion of the first structure, pattern, and/or layer. For example, a first structure, pattern, and/or layer first may be considered to be buried when it is at least partially embedded in a second structure, pattern, and/or layer.

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes.

Also, in the drawings, a shape or a size of each element is exaggerated for convenience of a description and clarity, and elements irrelevant to a description are omitted. Like reference numerals refer to like elements.

Embodiments are provided so that this disclosure will be thorough and complete, and will fully convey the concept of the inventive concept to one of ordinary skill in the art. However, this does not limit the inventive concept within specific embodiments and it should be understood that the inventive concept covers all the modifications, equivalents, and replacements within the idea and technical scope of the inventive concept. In describing the inventive concept, a detailed description of known techniques associated with the inventive concept unnecessarily obscure the gist of the inventive concept, it is determined that the detailed description thereof will be omitted.

To describe various items such as various regions, layers, and/or portions, the terms "first" and "second" may be used, but the items are not limited to the terms.

FIG. 1 is a cross-sectional view schematically illustrating a wafer-to-wafer bonding structure according to an example embodiment. Referring to FIG. 1, the wafer-to-wafer bonding structure according to an example embodiment may have a structure where a first substrate 101 is directly bonded to a second substrate 102.

The first substrate 101 may include a first insulation layer 201, a first metal pad 301 passing through the first insulation layer 201, and a first step AA (see FIGS. 3 and 4), and a barrier metal layer 400 each formed on a first junction surface. For example, the barrier metal layer 400 may be formed between the first substrate 101 and the first metal pad 301 and between the first insulating layer 201 and the first metal pad 301.

The first substrate 101 may be formed of a Group IV material wafer, such as a silicon wafer or a Groups III-V compound wafer. Also, the first substrate 101 may be configured as a monocrystalline wafer, such as a silicon monocrystalline wafer, in terms of a formation method. However, the first substrate 101 is not limited to a monocrystalline wafer, and other wafers, such as an epitaxial wafer, a polished wafer, an annealed wafer, and a silicon on insulator (SOI) wafer, may be used as the first substrate 101. Here, the epitaxial wafer may denote a wafer where a crystalline material is grown on a monocrystalline silicon substrate.

The first substrate 101 may include an impurity-doped well or an impurity-doped structure. Also, the first substrate 101 may include other device isolation structures, such as a shallow trench isolation (STI) structure.

The first insulation layer 201 may include nitride and/or oxide. The first insulation layer 201 may include a single layer or a multilayer. For example, the first insulation layer 201 may include silicon carbon nitride (SiCN) or tetra-ethyl-ortho-silicate (TEOS).

The first metal pad 301 may include, for example, copper (Cu). The first metal pad 301 may be formed through, for example, a plating process or a physical vapor deposition (PVD) process. For example, in a case where a plating process is used, a seed layer (not shown) may be formed through a sputtering process or a deposition process, a copper layer may be formed through a plating process by using the seed layer, and the copper layer may be planarized through a chemical mechanical polishing (CMP) process, thereby forming the first metal pad 301. A selectivity of a material included in the first metal pad 301 may differ from that of a material included in the first insulation layer 201.

The first metal pad 301, as illustrated, may have a structure where a width of a lower portion is relatively narrow and a width of an upper portion is relatively wide. For example, a width of the lower portion may be narrower than a width of the upper portion. However, a shape of the first metal pad 301 is not limited to a shape illustrated in the drawings. For example, the first metal pad 301 may have various shapes, such as an oval pillar and a polygonal pillar.

A structure of the first metal pad 301 may be formed through a damascene process. The damascene process is a known process, and thus, a detailed description thereof is omitted. An upper surface of the first metal pad 301 and an upper surface of the first insulation layer 201 may configure the same plane. For example, a first portion of an upper surface of the first metal pad 301 and an adjacent upper surface of the first insulation layer 201 may be coplanar, and a second portion of an upper surface of the first metal pad 301 and an adjacent upper surface of the first insulation layer 201 may be coplanar.

As described above, because the upper portion of the first metal pad 301 is formed to be relatively wide, a contact resistance may be reduced in bonding between metal pads 300. Also, bonding may be performed through a wide area, and thus, stronger bonding may be maintained.

The barrier metal layer 400 may be formed to surround a lower surface and a side surface of the first metal pad 301. The barrier metal layer 400 may contact the lower and side surfaces of the first metal pad 301. The barrier metal layer 400 may have a structure which is buried in the first insulation layer 201, based on a structure of the first metal pad 301. For example, the first metal pad 301 may be buried in the first insulation layer 201, and may be surrounded by the barrier metal layer 400.

The first metal pad 301 may have a structure where a width of the lower portion is narrow and a width of the upper portion is wide, and thus, based thereon, the barrier metal layer 400 may be formed in a structure where a lower interval is narrow and an upper interval is wide.

The barrier metal layer 400 may prevent the diffusion of metal, and for example, may include a stack structure of one or more materials selected from among titanium (Ti), tantalum (Ta), nitride titanium (TiN), and nitride tantalum (TaN). However, a material of the barrier metal layer 400 is not limited to the materials above.

The barrier metal layer 400 configured as a side surface of the first metal pad 301 may have the same height as that of the first metal pad 301. For example, an upper surface of the first metal pad 301 and an upper surface of the barrier metal layer 400 configured as the side surface of the first metal pad 301 may configure the same plane. This may be because the barrier metal layer 400 and the first metal pad 301 are planarized through a CMP process.

The second substrate 102, like the first substrate 101, may include a second insulation layer 202, a second metal pad 302 passing through the second insulation layer 202, and a first step BB (see FIGS. 3 and 4), and a barrier metal layer 400 each formed on a second junction surface. For example, the barrier metal layer 400 may be formed between the second substrate 102 and the second metal pad 302 and between the second insulating layer 202 and the second metal pad 302.

The barrier metal layer 400 may be formed to surround lower and side surfaces of the second metal pad 302. The barrier metal layer 400 may contact the lower and side surfaces of the second metal pad 302. The barrier metal layer 400 may have a structure which is buried in the second insulation layer 202, based on a structure of the second metal pad 302. For example, the second metal pad 302 may be buried in the second insulation layer 202, and may be surrounded by the barrier metal layer 400.

Also, structures or materials of the second substrate 102, the second insulation layer 202, the second metal pad 302, and the barrier metal layer 400 may be the same as the descriptions of the first substrate 101, first insulation layer 201, the first metal pad 301, and the barrier metal layer 400, respectively. Accordingly, detailed descriptions thereof are not repeated. Herein, the first substrate 101 and the second substrate 102 may be collectively referred to as substrates 100, the first insulation layer 201 and the second insulation layer 202 may be collectively referred to as insulation layers 200, and the first metal pad 301 and the second metal pad 302 may be collectively referred to as metal pads 300.

A first void CC may be formed between a portion of the first step AA, where a slope is formed, and a portion of the second step BB, where a slope is formed. The first void CC may be formed between the first metal pad 301 and the second metal pad 302. For example, the first void CC may be formed by surfaces of the first metal pad 301 and the second metal pad 302 that do not contact each other.

An image sensor including the wafer to wafer bonding structure includes an active pixel sensor (APS) array, a row decoder, a row driver, a column decoder, a timing generator, a correlated double sampler (CDS), an analog-to-digital converter (ADC), and an input/output buffer.

The APS array may include a plurality of unit pixel regions arranged in two dimensions. The APS array may convert optical signals into electrical signals. The APS array may be driven by a plurality of driving signals such as a pixel selection signal, a reset signal, and a charge transfer signal received from the row driver. In addition, the electrical signals output from the APS array may be provided to the CDS. The row driver may provide a plurality of driving signals for driving a plurality of unit pixel regions to the APS array according to the decoding result of the row decoder. When the unit pixel regions are arranged in a matrix, the driving signals may be provided to each row. The timing generator may provide a timing signal and a control signal to the row decoder and the column decoder. The CDS may receive the electrical signals generated by the APS array and hold the sample the received electrical signals. The CDS may double-sample a specific noise level and signal levels of the electrical signals and output difference levels between the noise level and the signal levels. The ADC may convert analog signals corresponding to the difference levels output from the CDS into digital signals and output the digital signals. The I/O buffer may latch the digital signals and sequentially output the latched signals to an image signal processor according to the decoding result of the column decoder.

A pixel circuit may be a circuit that generates an electrical signal using charges generated by a photoelectric converter PD. The pixel circuit may include four transistors, but embodiments are not limited to this case. The pixel circuit may include a transfer transistor TG, a floating diffusion region FD, a reset transistor RG, a source follower SF, and a selection transistor SEL. The photoelectric converter PD may absorb light and accumulate charges corresponding to the amount of light. The photoelectric converter PD may be, but is not limited to, a semiconductor photodiode, a phototransistor, a photogate, or a pinned photodiode. The photoelectric converter PD may be coupled to the transfer transistor TG which transfers the accumulated charges to the floating diffusion region FD. The floating diffusion region FD is a region that converts charges into a voltage and may cumulatively store charges due to its parasitic capacitance.

An end of the transfer transistor TG may be connected to the photoelectric converter PD, and the other end of the transfer transistor TG may be connected to the floating diffusion region FD. The transfer transistor TG may be a metal oxide semiconductor (MOS) transistor driven by a predetermined bias (e.g., a transfer signal TX). The transfer transistor TG may transfer a first optical signal, which corresponds to charges generated by the photoelectric converter PD, to the floating diffusion region FD according to the transfer signal TX.

The source follower transistor SF may amplify a change in an electric potential of the floating diffusion region FD which receives charged accumulated in the photoelectric converter PD and output the amplified change to an output line. When the source follower transistor SF is turned on, a predetermined electrical potential provided to a drain of the source follower transistor SF, for example, a power supply voltage may be transferred to a drain region of the selection transistor SEL.

The selection transistor SEL may select unit pixel regions to be read on a row-by-row basis. The selection transistor SEL may be a MOS transistor driven by a selection line which applies a predetermined bias (e.g., a row selection signal SX)

The reset transistor RG may periodically reset the floating diffusion region FD. The reset transistor RG may be a MOS transistor driven by a reset line which applies a predetermined bias (e.g., a reset signal RX). When the reset transistor RG is turned on by the reset signal RX, a predetermined electric potential provided to a drain of the reset transistor RG, for example, the power supply voltage may be transferred to the floating diffusion region FD.

Although the photoelectric converter PD of the pixel circuit has been described above as including a semiconductor photodiode formed on a semiconductor substrate containing silicon or the like, embodiments are not limited to this case. The photoelectric converter PD of the pixel circuit may also include an organic photodiode.

Figure 2:
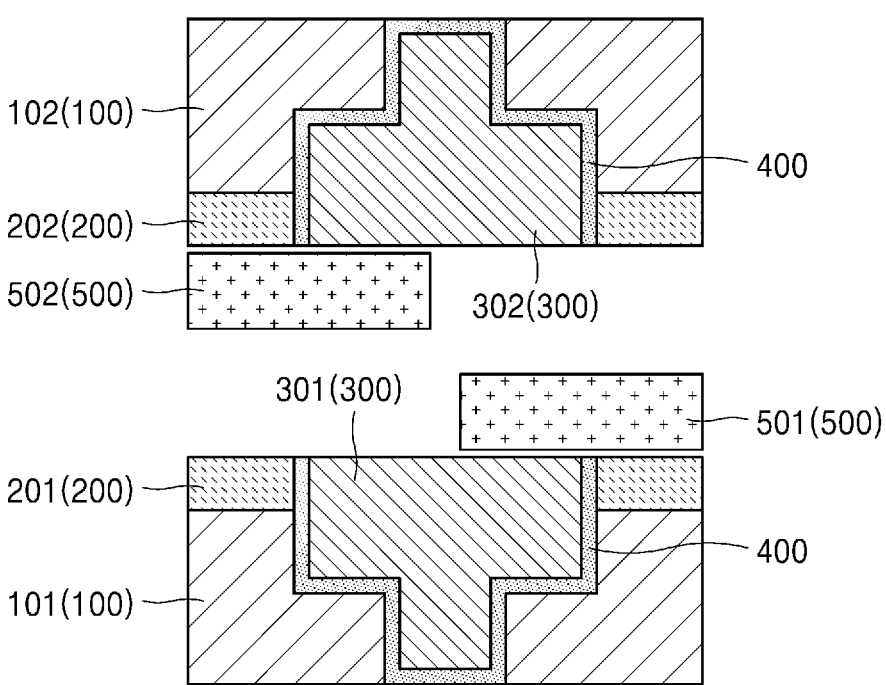
FIGS. 2, 3, and 4 are cross-sectional views schematically illustrating a process of manufacturing the wafer-to-wafer bonding structure illustrated in FIG. 1.
Figure 3:
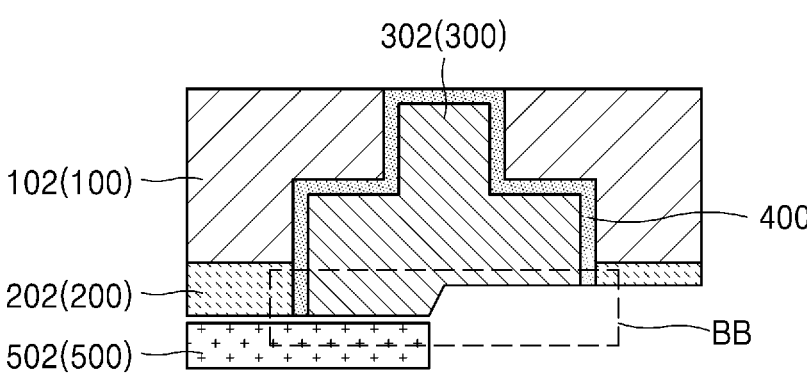
Figure 3:
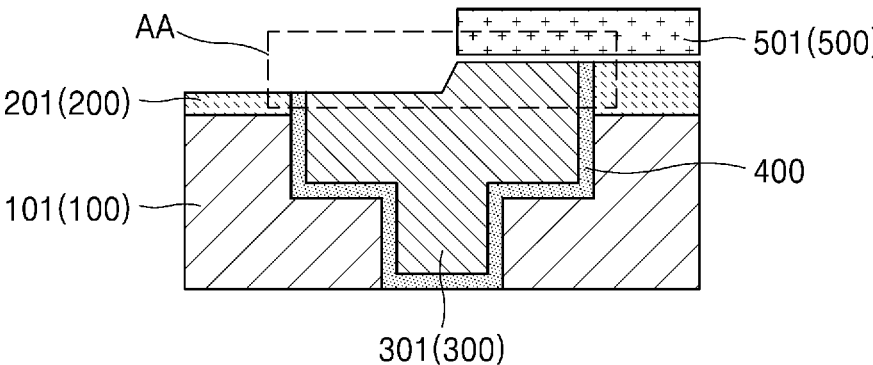
Figure 4:
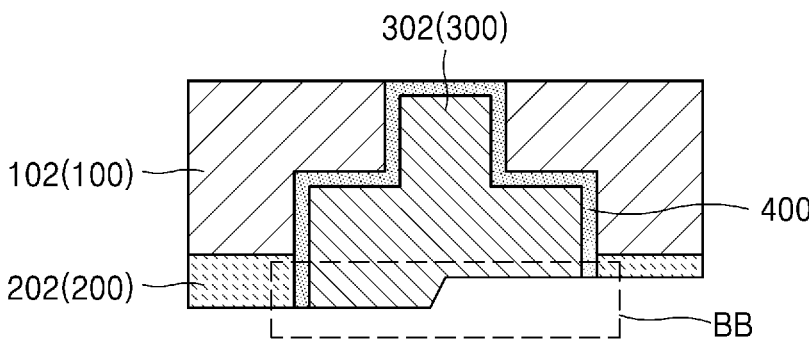
Figure 4:
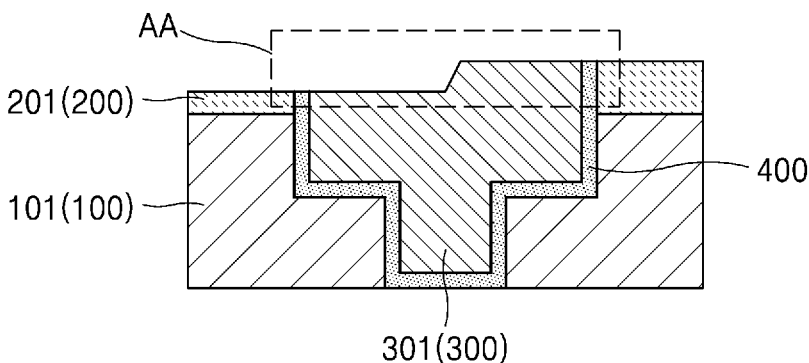

FIGS. 2, 3, and 4 are cross-sectional views schematically illustrating a process of manufacturing the wafer-to-wafer bonding structure illustrated in FIG. 1.

Referring to FIG. 2, in order to form a step having a slope shape, a first hard mask 501 may be first disposed on the first substrate 101, and a second hard mask 502 may be disposed on the second substrate 102. The first hard mask 501 and the second hard mask 502 may be collectively referred to as hard mask 500. A material of the hard mask 500 may be SiCN but is not limited thereto.

In this case, the hard mask 500 may cover a portion of an upper surface of each of metal pads 300. For example, the first hard mask 501 may cover a portion of an upper surface of the first metal pad 301, and the second hard mask 502 may cover a portion of an upper surface of the second metal pad 302. In this case, because a step formed in the first substrate 101 and a step formed in the second substrate 102 each include a slope having a symmetrical shape, a width and a position of the first hard mask 501 provided on the first metal pad 301 may be symmetrical with a width and a position of the second hard mask 502 provided on the second metal pad 302.

This may be because copper used as a material of the metal pad 300 is not etched well and may be for that a patterning process is performed in a state where the hard mask 500 is provided on a portion of an upper surface of the metal pad 300 and a step is easily formed through a CMP process.

Furthermore, the first hard mask 501 may cover a portion of an upper surface of the first metal pad 301, but may also cover a portion of the first insulation layer 201. Accordingly, a step having a slope shape may also be formed in the first insulation layer 201. In example embodiments, a first portion of an upper surface of the first insulation layer 201, a first portion of an upper surface of the barrier metal layer 400, and a first portion of an upper surface of the first metal pad 301 may be coplanar with one another, and a second portion of the upper surface of the first insulation layer 201, a second portion of the upper surface of the barrier metal layer 400, and a second portion of the upper surface of the first metal pad 301 below the first hard mask 501 may be coplanar with one another. A third portion of the upper surface of the first metal pad 301 may form a slope extending from the first portion to the second portion of the upper surface of the first metal pad 301. The third portion of the upper surface of the first metal pad 301 may be at an angle to both the first and second portions of the upper surface of the first metal pad 301.

Likewise, the second hard mask 502 may cover a portion of an upper surface of the second metal pad 302, but may also cover a portion of the second insulation layer 202. Accordingly, a step having a slope shape may also be formed in the second insulation layer 202. The drawings after a corresponding process may be understood with reference to FIG. 3. In example embodiments, a first portion of an upper surface of the second insulation layer 202, a first portion of an upper surface of the barrier metal layer 400, and a first portion of an upper surface of the second metal pad 302 may be coplanar with one another, and a second portion of the upper surface of the second insulation layer 202, a second portion of the upper surface of the barrier metal layer 400, and a second portion of the upper surface of the second metal pad 302 below the second hard mask 502 may be coplanar with one another. A third portion of the upper surface of the second metal pad 302 may form a slope extending from the first portion to the second portion of the upper surface of the second metal pad 302. The third portion of the upper surface of the second metal pad 302 may be at an angle to both the first and second portions of the upper surface of the second metal pad 302.

Referring to FIG. 3, a portion of the first metal pad 301 may be etched by using the first hard mask 501 as an etch mask. By etching a portion of the first metal pad 301, which is exposed because it is not covered by the first hard mask 501, the exposed portion of the first metal pad 301 may be opened, and thus, the first step AA having a slope shape may be formed. Accordingly, a depth of an open region may be increased by an etched depth. In example embodiments, the surface area of the upper surface of the first metal pad 301 may be increased by forming the first step AA having a slope shape.

Likewise, a portion of the second metal pad 302 may be etched by using the second hard mask 502 as an etch mask. By etching a portion of the second metal pad 302, which is exposed because it is not covered by the second hard mask 502, the exposed portion of the second metal pad 302 may be opened, and thus, the second step BB having a slope shape may be formed. Accordingly, a depth of an open region may be increased by an etched depth. In example embodiments, the surface area of the upper surface of the second metal pad 302 may be increased by forming the second step BB having a slope shape.

A result shown in FIG. 4 may be obtained by removing the hard mask 500 after the process ends. It may be seen that the first step AA and the second step BB each having a slope shape are respectively formed on the first junction surface of the first metal pad 301 and the second junction surface of the second metal pad 302.

Referring to FIG. 4, each of the first step AA and the second step BB may have a symmetrical slope shape. A height difference between a protrusion portion and a concave portion of the first step AA may not be greater than half of a thickness of the first substrate 101. Also, a height difference between a protrusion portion and a concave portion of the second step BB may have the same value as the height difference between the protrusion portion and the concave portion of the first step AA.

The first substrate 101 and the second substrate 102 may form direct bonding, and thus, the protrusion portion of the first step AA may be bonded to the concave portion of the second step BB. The first substrate 101 and the second substrate 102 may form direct bonding, and thus, the protrusion portion of the second step BB may be bonded to the concave portion of the first step AA.

The slope shape formed in each of the first step AA and the second step BB may have a slope angle which is not greater than about 20 degrees. The slope shape may include a curve section. The slope shape may connect up to a region where the first substrate 101 and the second substrate 102 are formed. The slope shape may not be formed in the region where the first substrate 101 and the second substrate 102 are formed.

Figure 5:
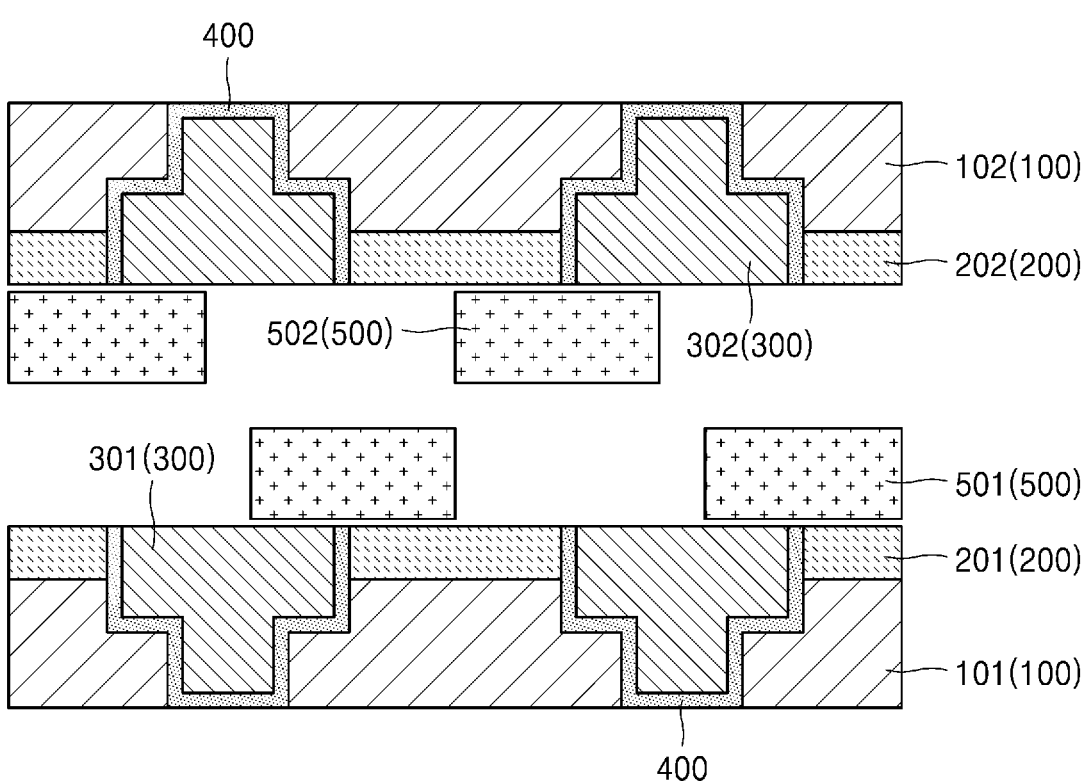
FIGS. 5, 6, and 7 are cross-sectional views schematically illustrating a process of manufacturing a wafer-to-wafer bonding structure, according to an example embodiment.
Figure 6:
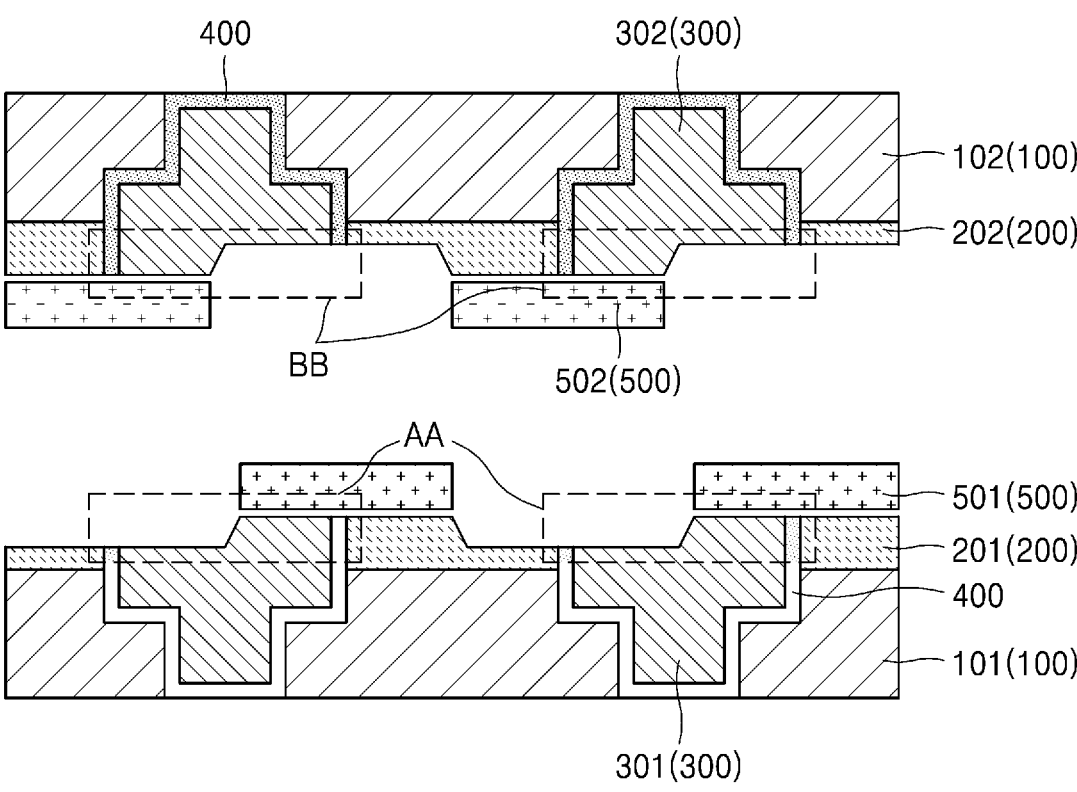
Figure 7:
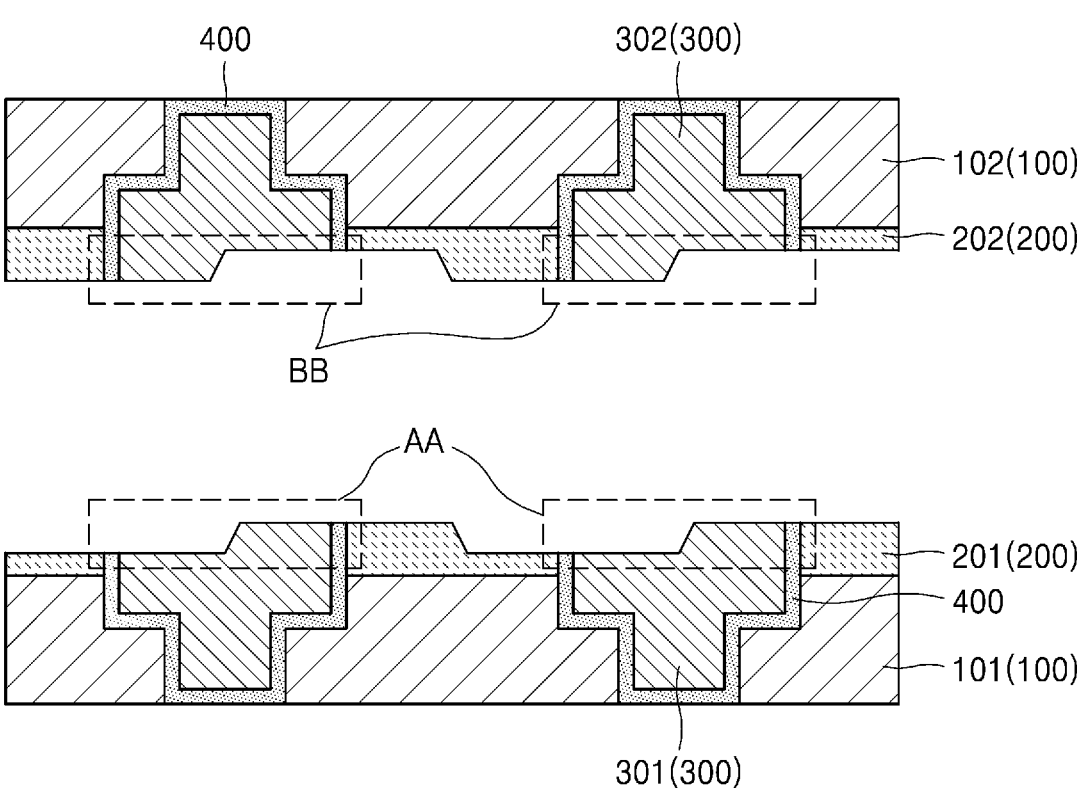

FIGS. 5, 6, and 7 are cross-sectional views schematically illustrating a process of manufacturing a wafer-to-wafer bonding structure, according to an example embodiment.

Figure 8:
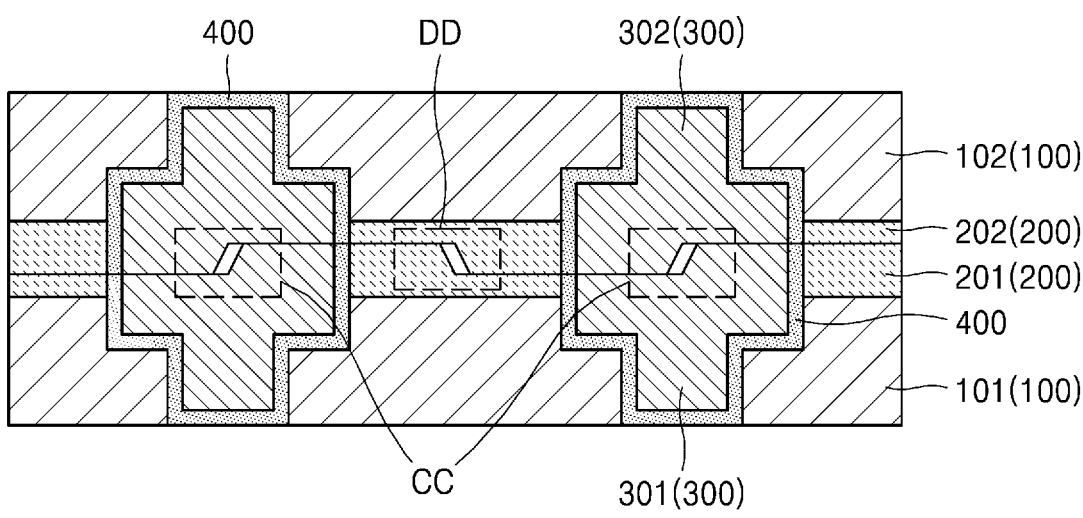
FIG. 8 is a cross-sectional view schematically illustrating a wafer-to-wafer bonding structure, according to an example embodiment.

FIG. 8 is a cross-sectional view schematically illustrating the wafer-to-wafer bonding structure according to an example embodiment illustrated in FIGS. 5, 6, and 7.

In FIGS. 5 to 8, a method of forming steps of a slope shape may be as described above, and thus, detailed descriptions of repetitive portions may be omitted.

Referring to FIG. 5, a plurality of first metal pads 301 may be arranged spaced apart from one another in a horizontal direction in the first insulation layer 201 of the first substrate 101. A plurality of second metal pads 302 may be arranged spaced apart from one another in a horizontal direction in the second insulation layer 202 of the second substrate 102. A plurality of first hard mask 501 may be provided on the first metal pads 301, and a plurality of second hard masks 502 may be provided on the second metal pads 302. Referring to FIG. 6, the first metal pads 301 and the second metal pads 302 may be etched to form a plurality of first steps AA and a plurality of second steps BB, respectively. For example, the plurality of first steps AA may be formed by the plurality of first metal pads 301, and the plurality of second steps BB may be formed by the plurality of second metal pads 302. Thereafter, referring to FIG. 7, the plurality of first hard mask 501 and the plurality of second hard masks 502 may be removed. Then, referring to FIG. 8, the first substrate 101 and the second substrate 102 may be bonded together.

The plurality of second steps BB may respectively engage with the plurality of first steps AA to form a symmetrical shape, and thus, direct bonding may be formed between the first substrate 101 and the second substrate 102.

Each of the plurality of first steps AA may have the same shape and height. Each of the plurality of second steps BB may have the same shape and height. In this case, a height difference between a protrusion portion and a concave portion of each of the plurality of second steps BB may have the same value as a height difference between a protrusion portion and a concave portion of each of the plurality of first steps AA.

The first substrate 101 where the first and second steps AA and BB having a symmetrical slope shape and the second substrate 102 having the same structure may be prepared through the process described above, and the first substrate 101 and the second substrate 102 may be disposed and arranged so that the first metal pad 301 faces the second metal pad 302 and the first junction surface of the first substrate 101 faces the second junction surface of the second substrate 102. Subsequently, the first metal pad 301 may be bonded to the second metal pad 302 through an annealing process, and thus, direct bonding between the first substrate 101 and the second substrate 102 may be formed.

Referring to FIG. 8, a wafer-to-wafer bonding structure having a structure illustrated herein may be implemented through bonding between the first substrate 101 and the second substrate 102.

In such a process, a plurality of first voids CC having the same shape may be provided between a portion of each of a plurality of first steps (not shown), where a slope is formed, and a portion of each of a plurality of second steps (not shown), where a slope is formed. The plurality of first steps (not shown) and the plurality of second steps (not shown) may have the same shape and height, and thus, the plurality of first voids CC may have the same shape and height.

Also, a second void DD having the same shape may be provided between portions where the first insulation layer 201 is bonded to the second insulation layer 202. For example, the second void DD may be formed by surfaces of the first insulation layer 201 and the second insulation layer

202 that do not contact each other. The second void DD may be provided in plurality. The plurality of second voids DD may have a mirror symmetrical shape with the plurality of first voids CC.

The first void CC and the second void DD may be an empty space which occurs after direct bonding between the first substrate 101 and the second substrate 102 is formed as a size of a pattern formed in the first substrate 101 and the second substrate 102 is reduced, based on misalignment between substrates.

As copper expands in a post annealing process performed after the first substrate 101 is bonded to the second substrate 102, the first void CC between a first metal pad 301 and a second metal pad 302 and the second void DD between the first insulation layer 201 and the second insulation layer 202 may be filled.

An annealing process may be performed at a temperature which enables bonding between the first metal pad 301 and the second metal pad 302 and bonding between the first insulation layer 201 and the second insulation layer 202 to be formed.

Figure 9A:
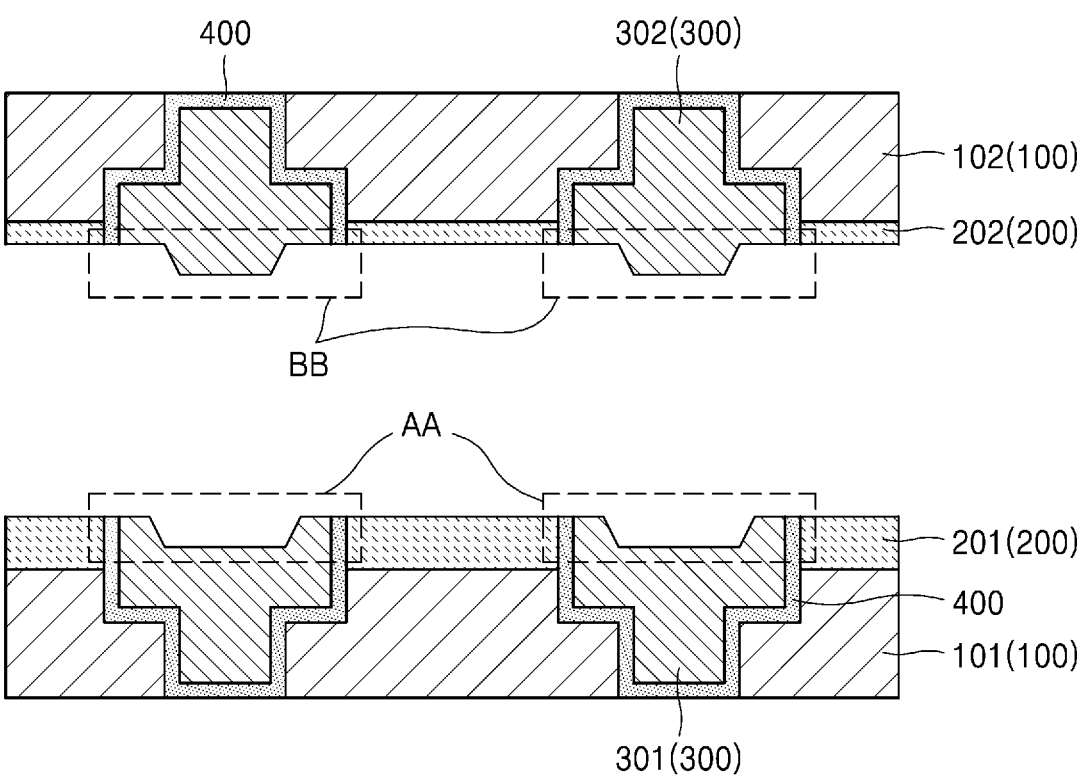
FIGS. 9A and 9B are cross-sectional views schematically illustrating a wafer-to-wafer bonding structure, according to an example embodiment.
Figure 9B:
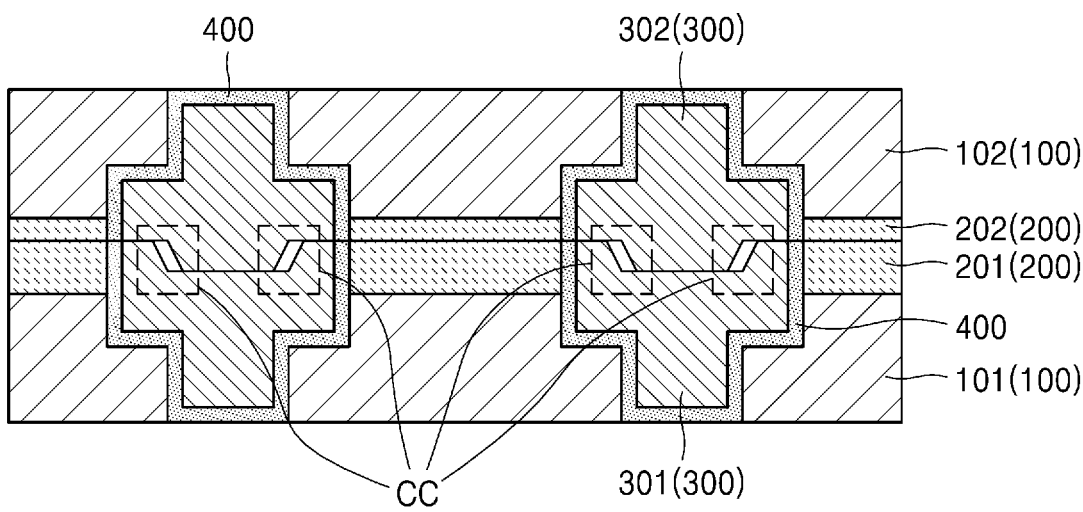

FIGS. 9A and 9B are cross-sectional views schematically illustrating a wafer-to-wafer bonding structure according to an example embodiment.

Referring to FIG. 9A, in the embodiment, each of steps AA and BB may have two slope shapes. As in the embodiment, one step may have two or more slope shapes.

Referring to FIG. 9B, in a case where a plurality of slope shapes are provided, a first substrate 101 may be bonded to a second substrate 102, and then, a plurality of first voids CC may be formed between bonded portions of a first step AA and a second step BB.

In the embodiment of FIGS. 9A and 9B, a void may not be formed between a first insulation layer 201 and a second insulation layer 202. In the example of FIGS. 9A and 9B, although not illustrated, the plurality of first hard mask 501 may be provided to entirely cover upper surfaces of the first insulation layer 201 and a portion of the upper surface of the first metal pad 301 of the first substrate 101, and the plurality of second hard masks 502 may be provided to cover only a portion of the upper surface of the second metal pad 302 of the second substrate 102.

Figure 10A:
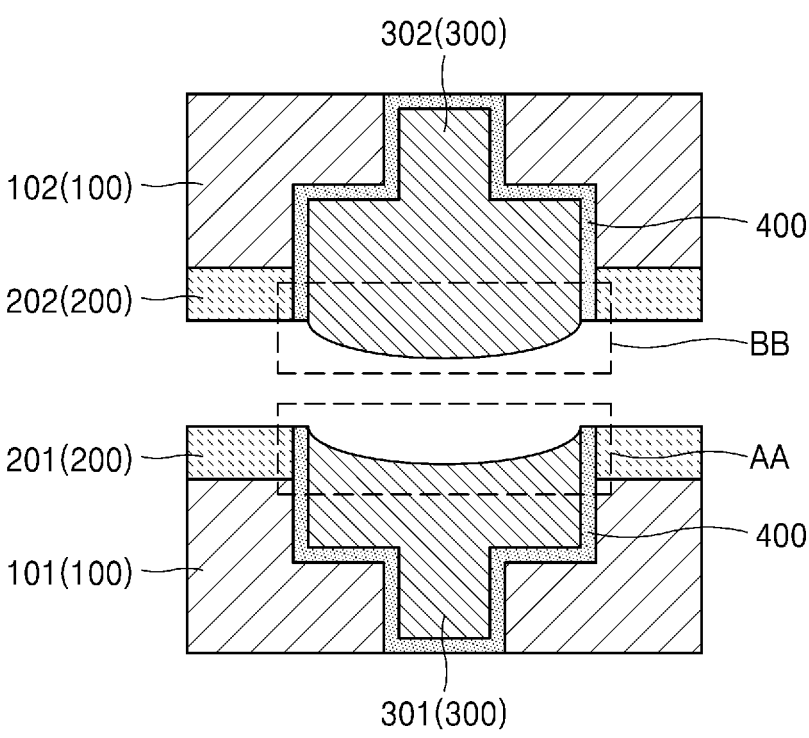
FIG. 10A is a cross-sectional view schematically illustrating a process of manufacturing a wafer-to-wafer bonding structure, according to an example embodiment.

FIG. 10A is a cross-sectional view schematically illustrating a wafer-to-wafer bonding structure according to an example embodiment. Referring to FIG. 10A, a step formed in each of a first step AA and a second step BB may include a curve shape. In this case, a step may not be formed in each of a first insulation layer 201 and a second insulation layer 202. The first step AA formed in a first junction surface may include an upward-concave curve shape. The second step BB formed in a second junction surface may include a downward-convex curve shape which is symmetrical with the first step AA.

Figure 10B:
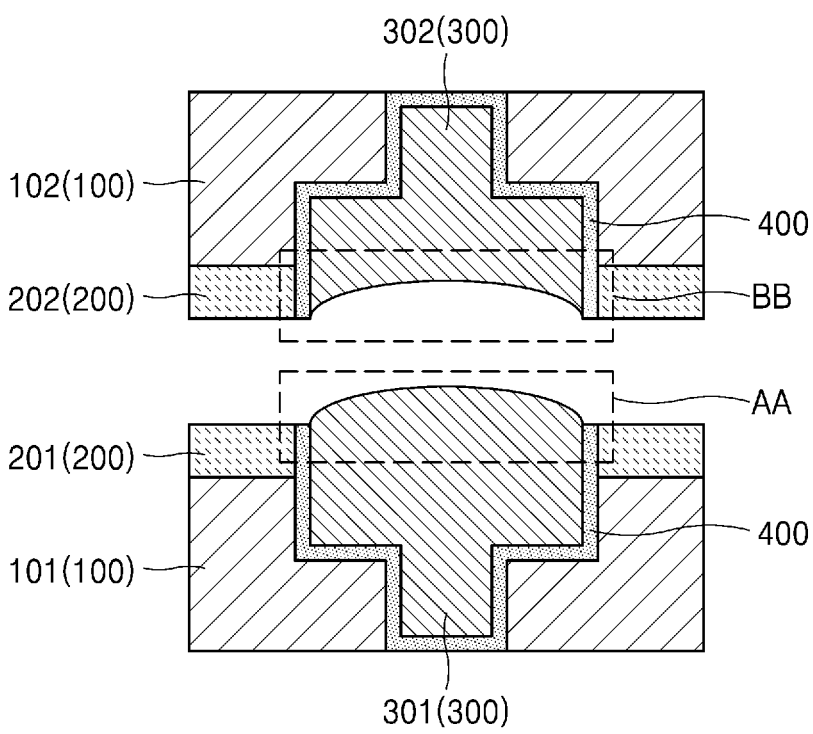
FIG. 10B is a cross-sectional view schematically illustrating a wafer-to-wafer bonding structure according to an example embodiment.

FIG. 10B is a cross-sectional view schematically illustrating a wafer-to-wafer bonding structure according to an example embodiment. Referring to FIG. 10B, a step formed in each of a first step AA and a second step BB may include a curve shape. In this case, a step may not be formed in each of a first insulation layer 201 and a second insulation layer 202. The first step AA formed in a first junction surface may include an upward-convex curve shape. The second step BB formed in a second junction surface may include a downward-concave curve shape which is symmetrical with the first step AA.

Figure 11A:
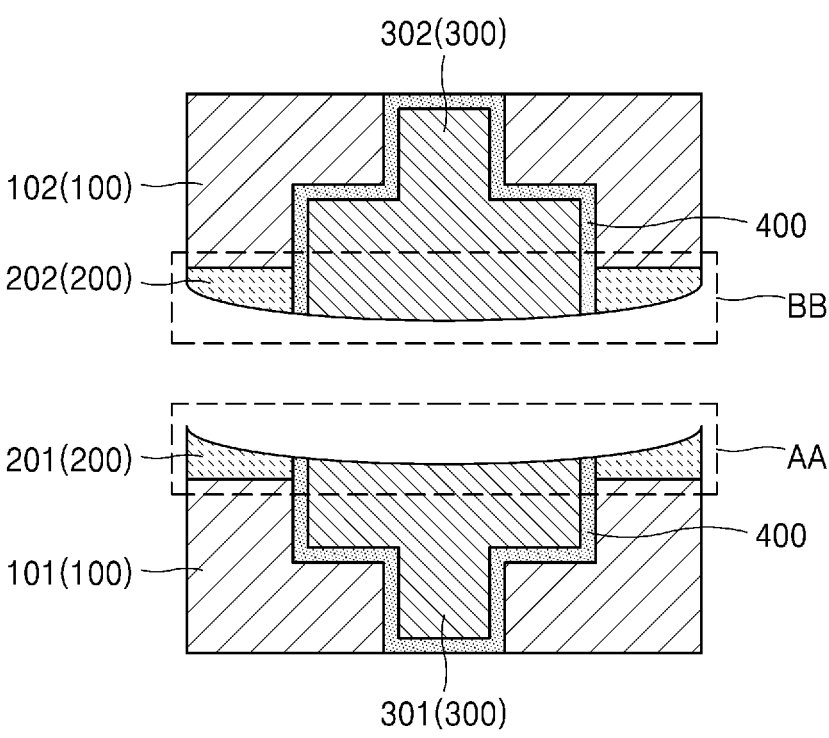
FIG. 11A is a cross-sectional view schematically illustrating a wafer-to-wafer bonding structure according to an example embodiment.

FIG. 11A is a cross-sectional view schematically illustrating a wafer-to-wafer bonding structure according to an example embodiment. Referring to FIG. 11A, a step formed in each of a first step AA and a second step BB may include a curve shape. In this case, a step having a curve shape may be formed in each of a first insulation layer 201 and a second insulation layer 202. The first step AA formed in a first junction surface may include an upward-concave curve shape. The upward-concave curve shape may extend and connect up to a region of the first insulation layer 201. The second step BB formed in a second junction surface may include a downward-convex curve shape which is symmetrical with the first step AA. The upward-convex curve shape may extend and connect up to a region of the second insulation layer 202.

Figure 11B:
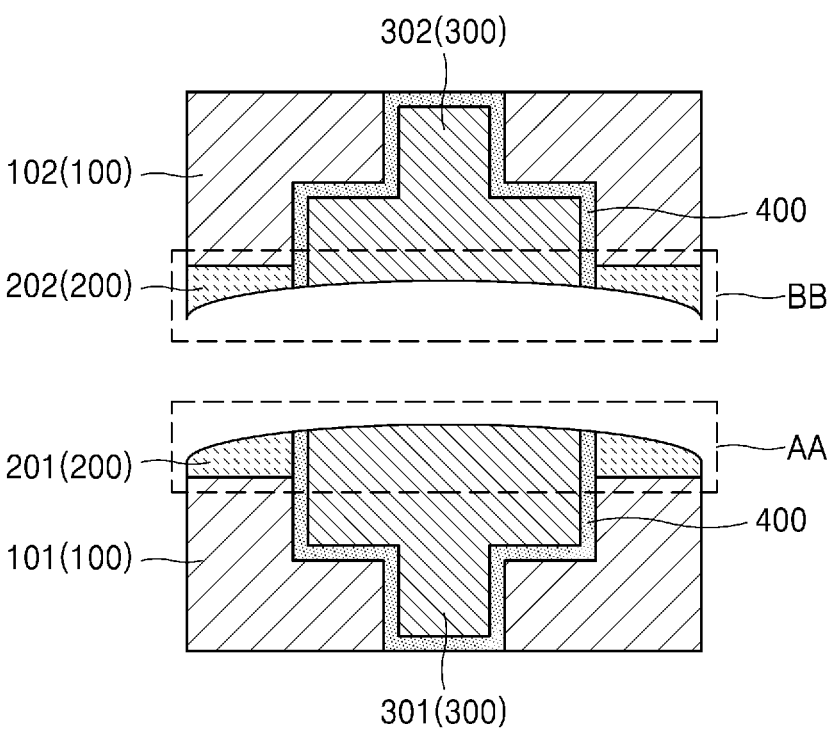
FIG. 11B is a cross-sectional view schematically illustrating a wafer-to-wafer bonding structure, according to an example embodiment.

FIG. 11B is a cross-sectional view schematically illustrating a wafer-to-wafer bonding structure according to an example embodiment. Referring to FIG. 11B, a step formed in each of a first step AA and a second step BB may include a curve shape. In this case, a step having a curve shape may be formed in each of a first insulation layer 201 and a second insulation layer 202. The first step AA formed in a first junction surface may include an upward-convex curve shape. The upward-convex curve shape may extend and connect up to a region of the first insulation layer 201. The second step BB formed in a second junction surface may include a downward-concave curve shape which is symmetrical with the first step AA. The downward-concave curve shape may extend and connect up to a region of the second insulation layer 202.

The wafer-to-wafer bonding structure according to an embodiment may have a structure where a first substrate 101 is bonded to a second substrate 102 through bonding between a first metal pad 301 and a second metal pad 302. In more detail, the first step AA formed in an upper surface of the first metal pad 301 and the second step BB formed in an upper surface of the second metal pad 302 may engage with each other and may be bonded to each other through copper-to-copper (Cu-to-Cu) direct bonding. However, the wafer-to-wafer bonding structure according to the inventive concept is not limited to the embodiments described above.

Figure 12:
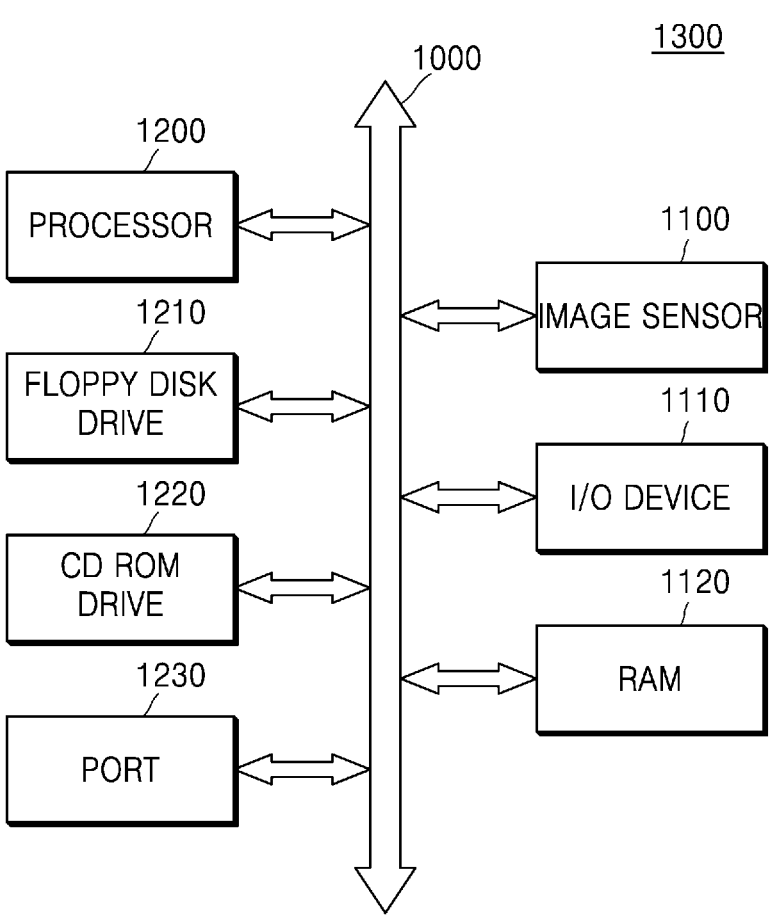
FIG. 12 is a block diagram of an imaging system including a wafer-to-wafer bonding structure, according to an example embodiment.

FIG. 12 is a block diagram of an imaging system including a wafer-to-wafer bonding structure, according to an example embodiment.

In detail, an electronic system 1300 may be a system which processes an output image of an image sensor 1100. The image sensor 1100 may be configured by applying at least one of the wafer-to-wafer bonding structures according to the embodiments described above. The imaging system may be all kinds of electronic systems equipped with the image sensor 1100, such as a computer system, a camera system, a scanner, and an image safety system.

The image sensor 1100 may include a substrate used as each of an upper substrate and a lower substrate, a photoelectric conversion device (PD), an insulation structure, a gate, a metal wiring, a through via, an insulation layer, a metal pad, a passivation layer, a color filter, and a microlens.

The substrate may be, for example, a P-type or N-type bulk substrate, be a P-type bulk substrate where a P-type or N-type epitaxial layer is grown, or be an N-type bulk substrate where a P-type or N-type epitaxial layer is grown.

The metal pad may be disposed on the insulation layer in a pad region to protrude from the substrate. The pad may include, for example, copper, but the inventive concept is not limited thereto. The metal pad may be formed by a damascene process, but the inventive concept is not limited thereto. In the pad region, the through via may be formed to pass through a portion of each of the insulation layer, the substrate, and an interlayer insulation layer. The through via may electrically connect the pad to the metal wiring.

The insulation layer may include, for example, SiCN, but the inventive concept is not limited thereto. A material included in the insulation layer may include a material having a selectivity which differs from that of a material included in the metal pad. Hereinafter, in the image sensor 1100, a portion to which the inventive concept is applied is mainly described, and the other description is omitted.

The image sensor 1100 may include: a lower substrate; and an upper substrate stacked on and bonded to the lower substrate, wherein the lower substrate may include: a lower insulation layer formed on an upper surface of the lower substrate; a lower metal pad passing through the lower insulation layer; and a lower step formed in the lower metal pad, the upper substrate may include: an upper insulation layer formed on a lower surface of the upper substrate; an upper metal pad passing through the upper insulation layer; and an upper step formed in the upper metal pad, and the upper step may engage with the lower step in a symmetrical slope shape to form direct bonding between the upper substrate and the lower substrate.

A bonding process used in the wafer-to-wafer bonding structure according to the inventive concept may be intactly applied to a portion where the upper substrate and the lower substrate of the image sensor 1100 form direct bonding.

As a result, in a portion where the upper substrate and the lower substrate configure a bonding structure, a height difference between a protrusion portion and a concave portion of the upper step may have the same value as that of a height difference between a protrusion portion and a concave portion of the lower step. In this case, a height difference may not be greater than half of a thickness of each of the upper substrate and the lower substrate. Also, the protrusion portion of the upper step may be bonded to the concave portion of the lower step, and the protrusion portion of the lower step may be bonded to the concave portion of the upper step.

Each of the upper step and the lower step may be formed by a process using a hard mask provided on a portion of an upper surface of each of the upper metal pad and the lower metal pad. When a patterning process and a CMP process are performed in a state where the hard mask is provided on a portion of the upper surface of each of the upper metal pad and the lower metal pad, a step may be easily formed.

Furthermore, the hard mask may cover a portion of the upper surface of each of the upper metal pad and the lower metal pad, but may also cover a portion of the upper insulation layer. Accordingly, a step having a slope shape may also be formed on the upper insulation layer. Also, the hard mask may cover a portion of the upper surface of the lower metal pad, but may also cover a portion of the lower insulation layer. Accordingly, a step having a slope shape may also be formed on the lower insulation layer. The slope shape may be formed so that a slope angle thereof is not greater than about 20 degrees. The slope shape may include a curve section.

A void may be provided between a portion, where a slope is formed, of the upper step and a portion, where a slope is formed, of the lower step. A void may be provided between bonded portion of the upper insulation layer and the lower insulation layer.

Referring to FIG. 12, the electronic system 1300 based on a processor, such as a computer system, may include a processor 1200, such as a central processing unit (CPU) or a microprocessor capable of communicating with an input/output (I/O) device 1110 through a bus 1000.

A floppy disk drive 1210, a CD ROM drive 1220, a port 1230, and random access memory (RAM) 1120 may be connected to the processor 1200 through the bus 1000 and may exchange data therebetween and may reproduce an output image corresponding to data of the image sensor 1100.

The RAM 1120 and the processor 1200 may be configured by applying at least one of the wafer-to-wafer bonding structures according to the embodiments described above.

The port 1230 may be a port for coupling of a video card, a sound card, a memory card, and a universal serial bus (USB) device or for transmitting or receiving data to or from another system.

The image sensor 1100 may be integrated along with processors, such as a CPU, a digital signal processor (DSP), and a microprocessor, and may be integrated along with a memory. Also, depending on the case, the image sensor 1100 may be integrated as a separate chip which differs from a processor.

The electronic system 1300 may be a system block diagram such as a camera phone and a digital camera among digital devices developed recently.

Hereinabove, embodiments have been described in the drawings and the specification. Embodiments have been described by using the terms described herein, but this has been merely used for describing the inventive concept and has not been used for limiting a meaning or limiting the scope of the inventive concept defined in the following claims. Therefore, it may be understood by those of ordinary skill in the art that various modifications and other equivalent embodiments may be implemented from the inventive concept.

While the inventive concept has been particularly shown and described with reference to embodiments thereof, it will be understood that various changes in form and details may be made therein without departing from the spirit and scope of the following claims.

What is claimed is:

1. An image sensor comprising:
a first substrate including a pixel array, a first multilayer wiring, a first insulation layer and a first metal pad buried in the first insulation layer; and
a second substrate on and bonded to the first substrate,
wherein the second substrate comprises a logic circuit, a second multilayer wiring, a second insulation layer facing the first insulation layer and a second metal pad buried in the second insulation layer,
wherein the first metal pad comprises a first protrusion surface, a first recessed surface, and a first sloped surface connecting the first protrusion surface with the first recessed surface, each of the first protrusion surface, the first recessed surface, and the first sloped surface being planar surfaces,
wherein the second metal pad comprises a second protrusion surface, a second recessed surface, and a second sloped surface connecting the second protrusion surface with the second recessed surface, each of the second protrusion surface, the second recessed surface, and the second sloped surface being planar surfaces,
wherein the first sloped surface faces the second sloped surface and is parallel with the second sloped surface, and
wherein a first void between bonded portions of the first metal pad and the second metal pad has a parallelogram shape that is defined by the first sloped surface, the second sloped surface, a portion of the first recessed surface, and a portion of the second recessed surface.

2. The image sensor of claim 1, wherein a height difference between the first protrusion surface and the first recessed surface is not greater than half of a thickness of the first substrate.

3. The image sensor of claim 1, wherein a height difference between the second protrusion surface and the second recessed surface has the same value as a value of the height difference between the first protrusion surface and the first recessed surface.

4. The image sensor of claim 1,
wherein the first protrusion surface of the first metal pad of the first substrate is bonded to the second recessed surface of the second metal pad of the second substrate, and
wherein the second protrusion surface of the second metal pad of the second substrate is bonded to the first recessed surface of the first metal pad of the first substrate.

5. The image sensor of claim 1, wherein a slope angle of the first sloped surface or the second sloped surface is less than or equal to about 20 degrees.

6. The image sensor of claim 1, wherein a portion of the first insulation layer adjacent to the first recessed surface has a thickness different from a thickness of a portion of the first insulation layer adjacent to the first protrusion surface.

7. The image sensor of claim 1, wherein a portion of a surface of the first insulation layer adjacent to the first recessed surface is at the same level as the first recessed surface, and a portion of the surface of the first insulation layer adjacent to the first protrusion surface is at the same level as the first protrusion surface.

8. The image sensor of claim 1,
wherein a selectivity of a material included in the first metal pad differs from a selectivity of a material included in the first insulation layer, and
wherein a selectivity of a material included in the second metal pad differs from a selectivity of a material included in the second insulation layer.

9. The image sensor of claim 1, further comprising:
a second void between bonded portions of the first insulation layer and the second insulation layer,
wherein the second void has a mirror symmetrical shape with the first void.

10. The image sensor of claim 1, further comprising:
a second void between bonded portions of the first insulation layer and the second insulation layer,
wherein a portion of a surface of the first insulating layer at a first side of the second void is at the same level as the first recessed surface, and a portion of the surface of the first insulating layer at a second side of the second void is at the same level as the first protrusion surface.

11. The image sensor of claim 1, wherein the first metal pad and the second metal pad are formed by a damascene process.

12. The image sensor of claim 1,
wherein a material of each of the first metal pad and the second metal pad comprises copper (Cu), and
wherein a material of the first insulation layer and the second insulation layer comprises silicon carbon nitride (SiCN).

13. An image sensor comprising:
a first substrate including a pixel array, a first multilayer wiring, a first insulation layer and a plurality of first metal pads arranged apart from one another in a horizontal direction to each be buried in the first insulation layer; and

a second substrate on and bonded to the first substrate, wherein the second substrate comprises a logic circuit, a second multilayer wiring, a second insulation layer facing the first insulation layer and a plurality of second metal pads arranged apart from one another in a horizontal direction to each be buried in the second insulation layer, wherein each of the plurality of first metal pads comprises a first junction surface comprising a first protrusion surface, a first recessed surface, and a first sloped surface connecting the first protrusion surface with the first recessed surface, each of the first protrusion surface, the first recessed surface, and the first sloped surface being planar surfaces, wherein each of the plurality of second metal pads comprises a second junction surface comprising a second protrusion surface, a second recessed surface, and a second sloped surface connecting the second protrusion surface with the second recessed surface, each of the second protrusion surface, the second recessed surface, and the second sloped surface being planar surfaces, wherein the first sloped surface of a first metal pad of the plurality of first metal pads faces and is parallel to the second sloped surface of a corresponding second metal pad of the plurality of second metal pads, and wherein a first void between bonded portions of the first metal pad of the plurality of first metal pads and the corresponding second metal pad of the plurality of second metal pads has a parallelogram shape that is defined by the first sloped surface of the first metal pad, the second sloped surface of the second metal pad, a portion of the first recessed surface of the first metal pad, and a portion of the second recessed surface of the second metal pad.

14. The image sensor of claim 13, wherein the first junction surface of each of the plurality of first metal pads has the same shape and the same height, and the second junction surface of each of the plurality of second metal pads has the same shape and the same height.

15. The image sensor of claim 13, wherein a height difference between the second protrusion surface and the second recessed surface of each of the plurality of second metal pads has the same value as a value of the height difference between the first protrusion surface and the first recessed surface of each of the plurality of first metal pads.

16. The image sensor of claim 13, wherein the first void is one of a plurality of first voids, each of the plurality of first voids being formed between the first sloped surface of one of the plurality of first metal pads and the second sloped surface of a corresponding one of the plurality of second metal pads.

17. The image sensor of claim 16, further comprising:

a plurality of second voids formed between bonded portions of the first insulation layer and the second insulation layer to have the same shape, wherein the plurality of second voids have a mirror symmetrical shape with the plurality of first voids.

18. An image sensor comprising:

a lower substrate; and an upper substrate stacked on and bonded to the lower substrate, wherein the lower substrate comprises:

a pixel array;

a lower multilayer wiring;

a lower insulation layer formed on an upper surface of the lower substrate;

a lower metal pad buried in the lower insulation layer; and a lower step formed in the lower metal pad, wherein the upper substrate comprises:

an upper insulation layer formed on a lower surface of the upper substrate;

a logic circuit;

a multilayer wiring;

an upper metal pad buried in the upper insulation layer; and an upper step formed in the upper metal pad, and wherein the lower step comprises a first protrusion surface, a first recessed surface, and a first sloped surface connecting the first protrusion surface with the first recessed surface, each of the first protrusion surface, the first recessed surface, and the first sloped surface being planar surfaces, wherein the upper step comprises a second protrusion surface, a second recessed surface, and a second sloped surface connecting the second protrusion surface with the second recessed surface, wherein the upper step engages with the lower step such that the first sloped surface faces and is parallel with the second sloped surface to form direct bonding between the upper substrate and the lower substrate, and wherein a first void between bonded portions of the lower metal pad and the upper metal pad has a parallelogram shape that is defined by the first sloped surface, the second sloped surface, a portion of the first recessed surface, and a portion of the second recessed surface.

19. The image sensor of claim 18, wherein a height difference between the first protrusion surface and the first recessed surface of the upper step has the same value as a value of a height difference between the second protrusion surface and the second recessed surface of the lower step, wherein the first protrusion surface of the upper step is bonded to the second recessed surface of the lower step, and wherein the second protrusion surface of the lower step is bonded to the first recessed surface of the upper step.

* * * * *